(12) United States Patent
Bakowski et al.

(10) Patent No.: US 6,201,280 B1
(45) Date of Patent: *Mar. 13, 2001

(54) TRANSISTOR OF SIC

(75) Inventors: Mietek Bakowski, Södertälje; Ulf Gustafsson, Linköping, both of (SE)

(73) Assignee: ABB Research Ltd., Zurich (CH)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/019,715

(22) Filed: Feb. 6, 1998

(51) Int. Cl.$^7$ ................................................. H01L 29/76
(52) U.S. Cl. ............................. 257/341; 257/331; 257/342
(58) Field of Search ................................. 257/139, 144, 257/77, 132, 133, 135, 147, 153, 618, 622, 331, 341, 342; 438/133, 137, 140

(56) References Cited

U.S. PATENT DOCUMENTS

| | | | |
|---|---|---|---|
| 5,034,785 | * 7/1991 | Blanchard | 257/330 |
| 5,079,602 | 1/1992 | Harada | 357/23.4 |
| 5,173,435 | 12/1992 | Harada | 437/31 |
| 5,397,717 | 3/1995 | Davis et al. | 437/40 |
| 5,506,421 | * 4/1996 | Palmour | 257/77 |
| 5,763,902 | * 6/1998 | Harris et al. | 257/139 |
| 5,801,408 | * 9/1998 | Takahashi | 257/212 |
| 5,909,039 | * 6/1999 | Bakowski et al. | 257/139 |

OTHER PUBLICATIONS

Baliga, "Power Semiconductor Device Figure of Merit for High–Frquency Applications," IEEE Electron Device Letters, vol. 10, No. 10, p. 455, Oct. 1989.*

Ruff et al., "SiC Devices: Physicss and Numerical Simulation," IEEE Trans on Electron Devics, vol. 41, No. 6, p. 1040, Jun. 1994.*

Baliga, Modern Power Devices, Power Mosfet, Chapter 7, John Wiley & Sons, Inc., 1996, pp. 335–371.

* cited by examiner

Primary Examiner—Minh Loan Tran
Assistant Examiner—Shouxiang Hu
(74) Attorney, Agent, or Firm—Pollock, Vande Sande & Amernick, R.L.L.P.

(57) ABSTRACT

A transistor of SiC for high voltage and high switching frequency applications is a MISFET or an IGBT. This transistor comprises a plurality of laterally spaced active regions. The center to center distance of two adjacent active regions defines a lateral width of a cell of the transistor. The relation of the lateral width of an accumulation region defined as the region in the drift layer connecting to a gate-insulating layer in each individual cell and the lateral cell width is selected so as to keep the power losses in the transistor as a consequence of switching below a determined proportion to the power losses relating to conduction of the transistor for a predetermined switching frequency and on-state voltage for which the transistor is designed.

11 Claims, 2 Drawing Sheets

TRANSISTOR OF SIC

BACKGROUND OF THE INVENTION

The present invention relates to a transistor of SiC for high voltage and high switching frequency applications having an insulated gate and being one of a) a MISFET and b) an IGBT, the transistor comprising, superimposed on each other in the following order: a drain; a highly doped substrate layer being for a) of n-type and for b) of p-type, for b) on top thereof one of c) a highly doped n-type buffer layer and d) no such layer; and a low doped n-type drift layer; the transistor further comprising a plurality of laterally spaced unit cells each having a highly doped n-type source region layer, a source arranged on top of the source region layer, a p-type channel region layer separating the source region layer from the drift layer, an insulating layer located next to the channel region layer and extending from the source region layer to the drift layer and to the channel region layer and the source region layer of an adjacent unit cell and a gate electrode arranged on the insulating layer and adapted to form a conducting inversion channel extending in the channel region layer at the interface to the insulating layer for electron transport from the source to the drain upon applying a voltage thereto, the center to center distance of two adjacent unit cells defining a lateral width of a unit cell of the transistor.

The accumulation region is defined for instance by Baliga in "Modern Power Devices" (John Wiley & Sons, Inc, 1996) on page 369. In Si transistors having an insulated gate, such as MOSFETs, the design is mainly directed towards achieving as low specific on-resistance as possible, since power losses emanating from switching are almost neglectable with respect to the on-state conducting loses in the case of the relatively low blocking voltages in such devices of Si. Furthermore, the high on-resistance in Si devices is the main obstacle in realizing devices for higher voltages. For this reason, it is most frequently a desire to keep the cell pitch, i.e. the center to center distance of two adjacent unit cells, as small as possible in order to increase the packing density and thus reduce the on-resistance. This is possible to do in the trench type of devices without other than technological limitations but in the DMOS type of devices the on-state voltage increases again as the cells are put too close together due to the so called JFET effect which is the increase in vertical resistivity between the adjacent p-base regions belonging to the neighboring cells. For a determined lateral cell width it is also aimed at having an accumulation region with a lateral width being as large as possible, since it is understood that the on-state voltage does decrease with increasing ratio of accumulation region width to the total cell width.

Gate-controlled transistors, such as MOSFETs, of SiC have the operating potential at much higher voltages than those of Si. This is mainly due to much lower specific on-resistance of the drift region for a given voltage (200 times lower for 1 kV devices) compared to Si. However, with increasing voltage the importance of the switching losses increases. The switching losses in gate-controlled transistors of SiC have to be considered in a new and more careful way than what was the case so far, especially for high voltage and high switching frequency applications, since the power losses relating to the switching may otherwise strongly limit the performance and the applicability of such a semiconductor device.

SUMMARY OF THE INVENTION

The object of the present invention is to provide a transistor of SiC having an insulated gate which makes it possible to better benefit from the superior property of SiC with respect to Si making operations at much higher voltages possible without being substantially limited by high switching losses.

This object, according to the invention, is obtained by providing a transistor in which the relation of lateral width of an accumulation region, defined as the region in the drift layer connecting to the insulating layer in each individual cell, and the lateral cell width is selected so as to minimize the total power losses in the transistor and to keep the power losses in the transistor as a consequence of switching in a certain determined proportion to the power losses relating to conduction of the transistor for a predetermined switching frequency for which the transistor is designed.

Due to this new "design rule" it will be possible to provide transistors if SiC for high voltage and high switching frequency applications operating while dissipating power at an acceptable low level under these conditions. It is a totally new concept for these types of transistors of SiC to vary the relation of the lateral width of the accumulation region and the lateral cell width to keep the power losses in the transistor due to switching at an acceptable low level with respect to the conduction losses, since it has probably been found more natural to vary the doping concentration of the drift layer or other parameters for this purpose. This type of selection is not known, either, to transistors of Si for which it has generally been an aim to make the lateral cell width as small as possible and the lateral width of the accumulation region as large as possible for a given lateral cell width, for obtaining as low specific on-state resistance as possible without concern for the small losses emanating from the switching. The same design rule applies also to Si devices or devices made of any other semiconducting material. However, the effect it has on both on-state voltage and switching losses depends on the doping density in the drift layer. This limits the design voltage range in which the rule is most efficient to below 4.5 kV in the case of Silicon but well above 25 kV in the case of SiC, as will be discussed below. The attractiveness of the design rule for the high voltage devices is thus significantly greater in the case of SiC.

According to a preferred embodiment of the invention the relation of the lateral width of the accumulation region and the lateral cell width is selected to obtain lower total power losses in the transistor as a consequence of both conduction and switching of the transistor and a desired relation of the conduction and switching losses to the total losses for a predetermined switching frequency. With a conventional design of such a transistor, namely with a lateral width of the accumulation region being as large as possible for a given lateral cell width, it was until now impossible to obtain lower power losses resulting from switching than those as a consequence of conduction for higher switching frequencies, but the selection of the relation of the lateral width of the accumulation region and the lateral cell width according to the invention makes this surprisingly possible.

According to another preferred embodiment of the invention the lateral width of the accumulation region is smaller than or equal to half the lateral cell width. This way of aiming at decreasing the quotient lateral width of the accumulation region/lateral cell width for keeping the power losses emanating from switching on an acceptable low level is a totally new approach to this problem within this technique, and it drastically improves the prospects of obtaining transistors of SiC for high voltage and high switching frequency applications without too high losses emanating from the switching. Thus, the present invention goes in the opposite direction of that in Si devices, in which it is natural to increase the lateral width of the accumulation region when this is possible, such as when the lateral cell width is increased. The present inventors have realized that the properties of SiC make it possible and highly desirable to take such measures. The doping concentration of the drift layer may in SiC devices be made much higher (by two orders of magnitude) than in Si due to the higher dielectric strength of SiC. This allows the reduction of the required width of the drift layer by one order of magnitude and makes it possible to reduce the on-state voltage by a factor of more than 300. However, the higher doping and thus reduced thickness of the space charge region means that the space charge capacitance is considerably higher for the SiC devices (one order of magnitude higher compared to Si). This means specifically that the Miller capacitance of the space charge region formed beneath the accumulation region will be ten times as high as in the case of Si. The value of this capacitance is also proportional to the width of the accumulation layer. The switching losses are in turn almost directly proportional to the Miller capacitance value which makes its influence on the total losses much more critical in a transistor of SiC than this capacitance has in the transistor of Si both designed for the same voltage. Furthermore, the very low on-state resistance in transistors of SiC makes this contribution much more significant, so for higher voltages and switching frequencies it would be very favorable to reduce this capacitance. This may be made by reducing the lateral width of the accumulation region, which will dramatically reduce the switching losses of the transistor. The increase in the on-state voltage caused by the reduction of the accumulation layer width is dependent on the doping density in the drift layer so that the punishment is less the higher the drift layer doping is. Simulations show that the design rule is effective at doping densities above $10^{13}$ cm$^{-3}$. This corresponds to the blocking voltage of about 4.5 kV in Si and well above 25 kV in SiC. At this low doping density the increase in the on-state resistance can easily be 100% with only minor reduction of switching losses. The opposite applies at high doping densities in the drift layer when reduction of switching losses may be over one order of magnitude with only minor increase of the on-state voltage. As an example, the comparison of the effectiveness of the design rule in the case of 1 kV MOSFET devices in Si and SiC is given based on simulations. The calculation performed at the identical structures with exception of the drift layer doping and thickness give the reduction of switching losses and increase of the on-state voltage by a factor up to 5 and 2, respectively, for the Si 1 kV MOSFET while the corresponding numbers for SiC 1 kV MOSFET are 15 and 1.3. The doping concentrations were $2 \cdot 10^{14}$ cm$^{-3}$ and $2 \cdot 10^{16}$ cm$^{-3}$ for the Si and SiC MOSFET, respectively. For the 4.5 kV MOSFET in the SiC (drift layer doping density $2 \cdot 10^{15}$ cm$^{-3}$) the corresponding factors were 6 and 1.8. The given examples illustrate clearly the significance of the drift layer doping for the impact of the design rule on the device performance.

According to another preferred embodiment of the invention half the lateral cell width is substantially larger than the lateral width of the accumulation region, which means a low capacitance of the space charge region formed beneath the accumulation region under forward blocking conditions resulting in considerably reduced switching losses with respect to the circumstances normally prevailing in power transistors with a larger lateral width of the accumulation region than of the cell width/2. In a further development of this embodiment, half the lateral cell width is more than twice, three times or five times larger than the lateral width of the accumulation region, which is quite contrary to prior art transistors and results in a substantially lower contribution of the switching losses to the total losses in the operation of high power and high frequency transistors.

According to another preferred embodiment of the invention the lateral cell width is substantially larger than the smallest possible lateral cell width obtainable through conventional semiconductor manufacturing techniques for defining a saturation current density of the transistor being low with respect to the highest possible such saturation current density. It is often of interest in power applications to utilize the current saturation feature of MISFETs and IGBT-type of devices, which may be done by controlling the density of the elementary cells and more specifically by the lateral cell width or the so-called cell pitch. When the lateral cell width is selected so as to obtain a particular saturation current density for making the transistor enter into current-limiting mode at a certain current density, it will mostly be possible to vary the relation between the lateral cell width and the lateral width of the accumulation region within a wide range, and in the case of a transistor of Si it is natural to increase the lateral width of the accumulation region when the cell pitch is increased; but, for the inventive transistor of SiC the possibility to keep the lateral width of the accumulation layer small will instead be utilized for lowering the switching losses. Accordingly, the frequent use of the current saturation feature in transistors of this type will provide freedom to utilize the design rule of the present invention to a large extent.

According to other preferred embodiments of the invention the lateral cell width is larger than 10 µm and 30 µm, respectively. When the lateral cell width is that large it will normally be possible to vary the relationship between the lateral cell width and the lateral width of the accumulation region considerably, since they may normally each be made as small as about 5 and 2 µm, respectively.

According to another preferred embodiment of the invention the transistor is intended for switching frequencies exceeding $10^3$ Hz. It has been found that it is interesting to vary the relationship of lateral cell width and lateral width of the accumulation region when the switching frequency exceeds this level, since the switching losses will as of this level constitute a considerable part of the overall losses of such a transistor for high voltage application, i.e. voltages above 1 kV.

According to another preferred embodiment of the invention the transistor is intended for switching frequencies exceeding $10^4$ Hz. For these high frequencies the switching losses for a transistor of a conventional design, i.e. with a lateral width of the accumulation region being larger than half the lateral cell width, may well be considerably greater than the conduction losses, but they may be lowered remarkably by making the lateral width of the accumulation region smaller according to the present invention.

According to another preferred embodiment of the invention the doping concentration of the drift layer exceeds $10^{15}$ cm$^{-3}$. The advantages of the transistor according to the present invention are particularly accentuated at such high doping concentrations, since the capacitance of the space charge region will then be high for a determined lateral width of the accumulation region.

BRIEF DESCRIPTION OF THE DRAWINGS

With reference to the appended drawings, below follows a specific description of preferred embodiments of the invention cited as examples.

In the drawings.

DETAILED DESCRIPTION OF PREFERRED EMBODIMENTS

Figure 1:
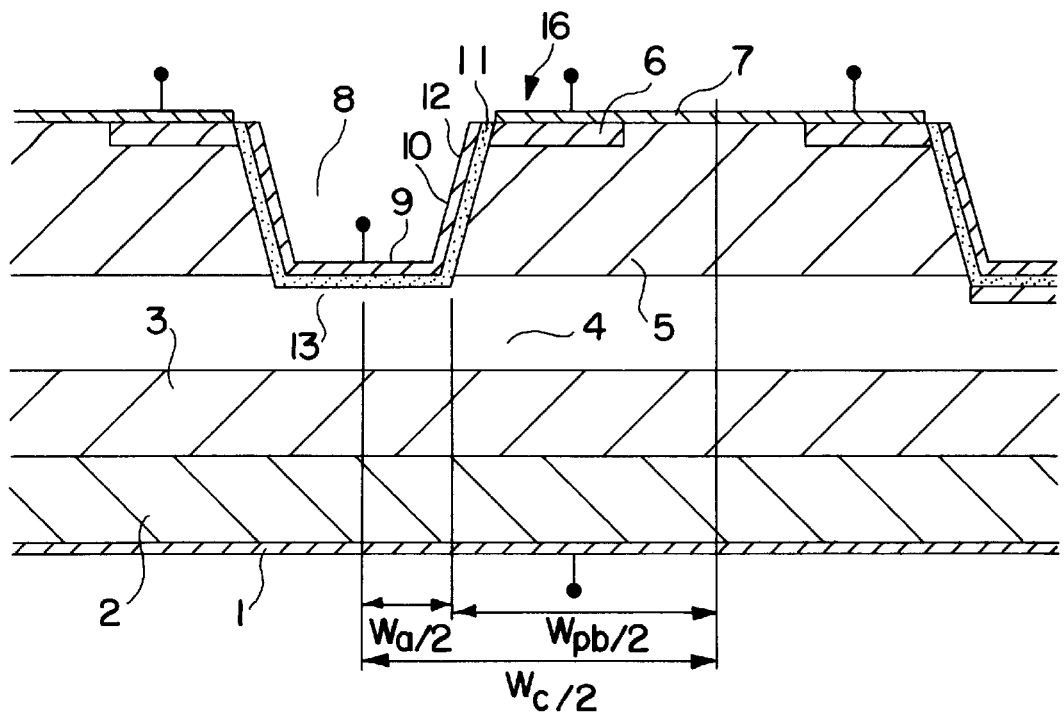
FIG. 1 is a schematic cross-section view illustrating an IGBT of trench type manufactured according to the design rule of the present invention.

An IGBT made of SiC according to a first preferred embodiment of the invention is illustrated in FIG. 1. However, it should be noted that the relative thicknesses of the layers and regions in this device shown in this figure have only been chosen for the sake of clarity of the drawings. This device comprises, superimposed in the following order: a drain contact 1, a highly doped p-type substrate layer 2, a highly doped n-type buffer layer 3 and a low doped n-type drift layer 4. The doping concentration of the drift layer 4 is typically in the range of $10^{15}$–$10^{16}$ cm$^{-3}$, whereas it is in the range $5\times10^{18}$–$5\times10^{20}$ cm$^{-3}$ for the substrate and buffer layers. A p-type base layer 5 is arranged on top of the drift layer 4. Furthermore, a highly doped n-type source region layer 6 is arranged on top of a region of the base layer 5, and this layer may be formed by ion implantation and subsequent annealing, whereas the rest of the layers are produced by epitaxy. A source contact 7 is applied on the source region layer 6 and also provides contact to the p-base layer.

A substantially vertical trench 8 is carried out from above through the base layer and at least to the drift layer. The bottom 9 and the substantially vertical walls 10 are made of two layers, namely an inner insulating layer 11, such as a thermal oxide (SiO$_2$) or AlN, and an outer gate metal layer 12. This type of device is already known, and also the function thereof, which may be summarized as follows. When a positive voltage above a threshold value is applied on the gate electrode 12 a conducting inversion channel will be formed in the base layer 5 at the interface between this base layer and the insulating layer 11 of the trench wall, which means that electrons flow from the source region layer to the drift layer and further to the drain. But at the same time holes will be injected from the substrate layer into the buffer layer and drift layer and travel into the base layer for recombination with excess electrons in the source region layer. It is illustrated how a so-called accumulation layer 13 is formed under the insulating layer in the drift layer. The lateral width of this accumulation layer influences the on-resistance of the device, and the on-resistance will be lower the larger the lateral width of this accumulation region is. However, the on-resistance will not suffer as much in SiC when the lateral width of this accumulation region decreases due to two orders of magnitude higher doping level required for the same voltage as compared to Si, as discussed above.

A device of the type shown in FIG. 1 may be used in converters in power stations, where the switching frequency may be 1 kHz or more, i.e. the transistor will be turned on with this frequency. The switching losses increase with the switching frequency and for higher frequencies can be well over the power losses due to conduction, which increases the relevance of the present invention.

The transistor shown in FIG. 1 is designed according to a design rule differing from the prior art. It is illustrated that the transistor comprises a plurality of laterally spaced MOSFET or IGBT unit cells 16, and the center to center distance of two adjacent unit cells, here of two adjacent accumulation regions 13, defines a lateral width $W_c$ of a unit cell of the transistor. It is illustrated how the lateral width of the accumulation region $W_a$ is considerably smaller than half the lateral cell width $W_c$. It may also be said that the lateral width $W_{pb}$ of the p-type base layer is clearly larger than the lateral width of the accumulation region. This is quite contrary to prior art, in which it is tried, for a certain cell pitch $W_c$ tried, to make the lateral width of the accumulation region $W_a$ as large as possible for lowering the on-resistance of the transistor. The explanation for this selection will be discussed more in detail below with reference to FIGS. 4–6.

Figure 2:
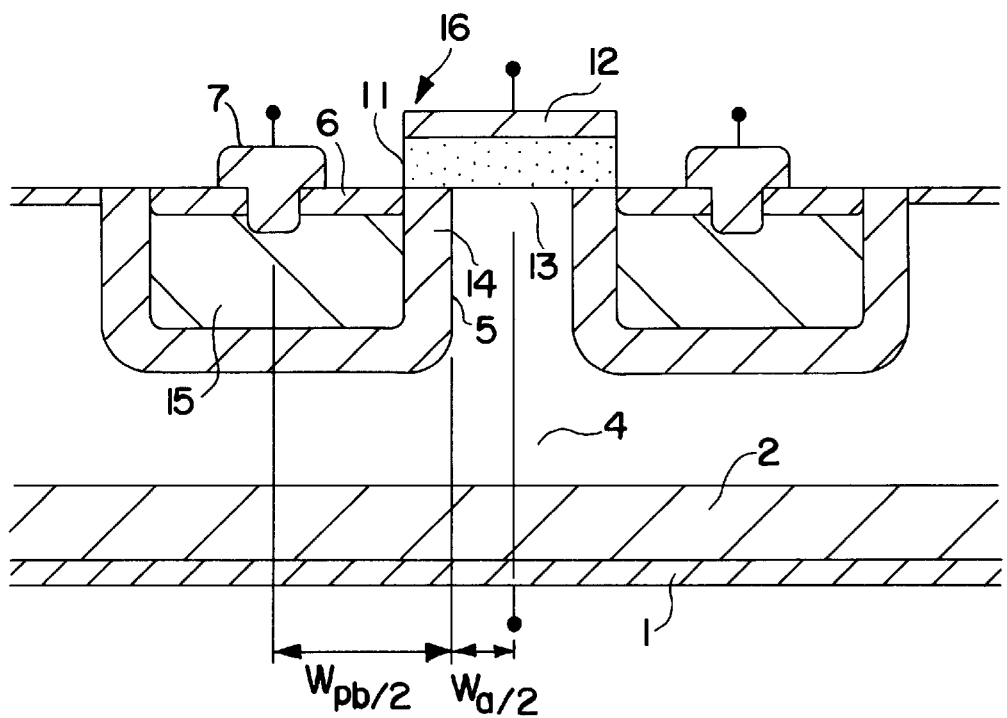
FIG. 2 is a schematic cross-section view illustrating a MISFET of planar type manufactured according to the design rule of the present invention.

FIG. 2 shows a transistor according to another preferred embodiment of the invention, which primarily differs from that shown in FIG. 1 in that it has no buffer layer, the substrate layer is highly n-doped, it is of the planar type and has a lateral channel instead of a vertical one. The layers of this MISFET corresponding to layers of the transistor according to FIG. 1 have been provided with the same reference numerals. In this transistor the base layer 5 is divided into a low doped p-type channel region layer 14 and a p-well 15 created by implantation. The layer 14 may be formed by diffusion of p-type implants, such as Al or B, from the layer 15 when annealing it. It is illustrated how the inventive design rule is also used here, in that the lateral width $W_a$ of the accumulation region 13 is smaller than the lateral width $W_{pb}$ of the p-well 15, although the manufacturing techniques would allow the creation of an accumulation region having a lateral width being considerably larger than the lateral width of the p-well.

Figure 3:
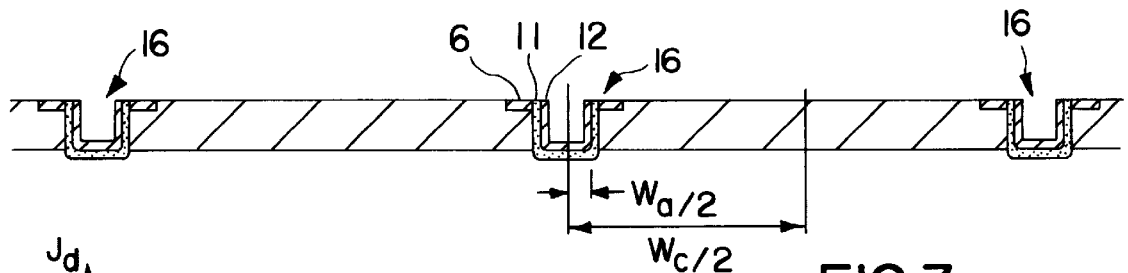
FIG. 3 is a schematic cross-section view of a part of a gate-controlled transistor according to a preferred embodiment of the invention.

It is schematically illustrated in FIG. 3 how the lateral width of the accumulation region in a transistor of the type illustrated in FIG. 1 is only about a tenth of the lateral cell width of the transistor. The lateral width of the accumulation region may be about 2 μm, which would then result in a cell pitch of 20 μm. For a prior art device of Si with this cell pitch the lateral width of the accumulation region would normally be much larger than half the lateral cell width.

Figure 4:
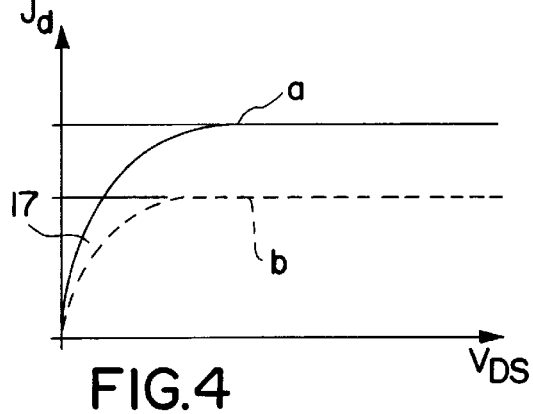
FIG. 4 is a graph of the current density versus the voltage applied over a transistor of the type shown in any of FIGS. 1–3 in the forward blocking direction thereof for two different pitches, i.e. two different sizes of the lateral cell width in the transistors.

It is illustrated in FIG. 4 how the current density (J$_D$) of a transistor according to FIG. 1 or 2 is varying with the voltage V$_{DS}$ between the drain and the source of the transistor for two different pitches, namely a small pitch a and a large pitch b, and for a given constant value of the gate voltage. It is noticed that the saturation current density J$_D$ may be varied by changing the pitch, and the smaller the pitch the higher the saturation current density. Smaller pitch also results in a lower on-state resistance of the device defined through the lower and linear part 17 of the curves. In transistors of Si the on-resistance is much higher than in transistors of SiC, so that it is tried to keep the pitch as small as possible for keeping the power losses due to on-resistance on an acceptable low level. However, in transistors of SiC the specific on-resistance of the drift layer for a given voltage is much lower than for Si, so that it will be of less importance to keep the pitch small, and the saturation current density behavior of a device of this type may be better utilized. Accordingly, the freedom is larger to choose a pitch desired for obtaining a predetermined saturation current density. This normally means larger pitches and a possibility to vary the relationship of the lateral width of the accumulation region and the lateral cell width within a wide range.

Due to higher voltages and the lower specific on-resistance the importance of switching losses increases in SiC devices in comparison with devices of Si. The doping concentration in the drift layer in a transistor of SiC is about two orders of magnitude higher than in Si, which means that the thickness needed in Si for holding a certain voltage in the blocking state of the device will be only a tenth for SiC than for Si. Accordingly, the thickness of the space charge region $W_{SC}$ will be only about a tenth for SiC. However, the capacitance $C_{SC}$ of the drift layer resulting from the accumulation region 13 is reciprocally proportional to $W_{SC}$, which means that this capacitance, for a given lateral width of the accumulation region, will be about ten times higher for SiC than for Si. Furthermore, the switching losses are roughly proportional to the Miller capacitance, which in its turn is substantially proportional to the lateral width of the accumulation region. This means that a reduction of the lateral width of the accumulation region in a transistor of SiC will result in a much larger reduction of the switching losses than in a device of Si (for comparable design voltage), and having the low on-resistance in transistors of SiC in mind, the influence upon the total losses of such a transistor by such a reduction may be dramatic.

Figure 5:
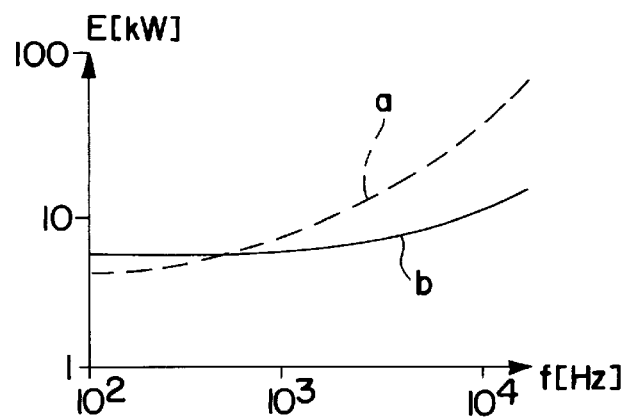
FIG. 5 is a graph of the total losses versus the switching frequency for a transistor designed according to prior art and a transistor designed according to the design rule of the present invention.
Figure 6:
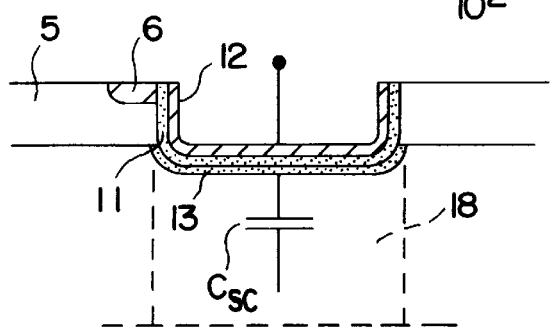
FIG. 6 is a schematic cross-section view of a part of a transistor according to the present invention with the capacitance of the space charge region shown for explaining the present invention.

FIG. 5 illustrates the total losses E in a MOSFET with a blocking voltage of 4.5 kV, a current of 100 A/cm$^2$ and a pitch of 50 m for a conventional design (curve a), in which the lateral width of the accumulation region is five times the lateral width of the base layer, and a transistor according to a preferred embodiment of the invention (curve b), in which the lateral width of the accumulation region is only a tenth of the lateral width of the base layer. It appears that for the transistor of conventional design the total losses are slightly lower than for the transistor according to the invention at frequencies f below a couple of 100 Hz, but for frequencies above 10$^3$ Hz the total losses become lower for the transistor according to the present invention, since for these frequencies the switching losses depending on the capacitance $C_{SC}$ of the space charge region beneath the accumulation region (18 in FIG. 6) get considerable. For a switching frequency of 10$^4$ Hz the total losses will be about 10 kW instead of about 35 kW, which constitutes an important improvement. The design rule according to the present invention is most favorable for transistors with blocking voltages of 1–10 kV or higher and operated with switching frequencies above 1 kHz.

The invention is of course not in any way restricted to the preferred embodiments described above, but many possibilities for modifications thereof would be apparent to a man with ordinary skill in the art without departing from the basic idea of the invention as defined in the appended claims.

The number of layers mentioned in the claims is a minimum number, and it is within the scope of the invention to arrange further layers in the devices or dividing any layer into several layers by selective doping of different regions thereof.

"Substrate layer" is in this disclosure to be interpreted as the layer closest to the drain of the layers mentioned and it need not be a substrate layer in the strict sense of the word within this field, i.e. the layer from which the growth is started. The real substrate layer may be any of the layers and is mostly the thickest one, which may be the drift layer.

"Transistor of SiC" does not exclude that some parts of the transistor are made of another material, such as contacts and insulating layers.

MISFET is defined as a transistor having the structure of a MOSFET, but I instead of O indicates that the gate insulating layer may be of another material, such as AlN, rather than a thermal oxide.

All the discussion so far concerning device design has been based on the linear or strip cell topology. It is obvious to those skilled in the art that findings are by no means limited to only that type of cell arrangement. Any other regular or irregular cell topology can be treated analogously by defining a linear design equivalent to any other cell arrangement. We define an equivalent to any cell topology other than linear as being a linear cell design with identical ratio of total channel width per unit area. The claims are thus formulated for a linear cell topology and apply to any other cell arrangement when transformed into the strip equivalent preserving the total channel width per unit area ratio of the original cell topology and with preservation of all other relevant design parameters like channel length, doping concentrations etc.

What is claimed is:

1. A transistor of SiC for high voltage and high switching frequency applications having an insulated gate and being one of:
    a MISFET; and
    an IGBT;
    said transistor comprising, superimposed on each other in the following order:
        a drain;
        a highly doped substrate layer being of n-type when said transistor is a MISFET and being of p-type when said transistor is an IGBT;
        a highly doped n-type buffer layer when said transistor is an IGBT; and a low doped n-type drift layer;
    said transistor further comprising a plurality of laterally spaced unit cells, each having:
        a highly doped n-type source region layer;
        a source arranged on top of the source region layer;
        a p-type channel region layer separating the source region layer from the drift layer;
        an insulating layer located adjacent to the channel region layer and extending from the source region layer to the drift layer and to the channel region layer and source region layer of an adjacent unit cell; and
        a gate electrode arranged on the insulating layer and adapted to form a conducting inversion layer extending in the channel region layer at the interface to the insulating layer for electron transport from the source to the drain upon applying a voltage thereto, the center-to-center distance between two adjacent unit cells defining a lateral width of a unit cell of the transistor;
    wherein:
        the relation of the lateral width of an accumulation region, defined as the region in the drift layer connecting to the insulating layer in each individual cell, and the lateral cell width is selected so as to minimize the total power losses in the transistor and to control the proportion of the power losses in the transistor as a consequence of switching, relative to the power losses relating to conduction of the transistor, for a predetermined switching frequency and on-state voltage for which the transistor is designed; and said lateral cell width is more than ten times larger than the lateral width of said accumulation region.

2. A transistor according to claim 1, wherein the relation of the lateral width of said accumulation region and the lateral cell width is selected to obtain lower power losses in the transistor as a consequence of switching of the transistor than of the conduction thereof for a predetermined switching frequency and on-state voltage for which the transistor is designed.

3. A transistor according to claim 1, wherein said lateral cell width is substantially larger than the smallest possible lateral cell width obtainable through process design rules, for a minimum feature size and nesting tolerance, and said relation between said lateral width of an accumulation region and said lateral cell width is selected to obtain a predetermined saturation current density.

4. A transistor according to claim 1, wherein said lateral cell width is larger than 10 $\mu$m.

5. A transistor according to claim 1, wherein said lateral cell width is larger than 30 $\mu$m.

6. A transistor according to claim 1, wherein said predetermined switching frequency exceeds $10^3$ Hz.

7. A transistor according to claim 1, wherein said predetermined switching frequency exceeds $10^4$ Hz.

8. A transistor according to claim 1, wherein the doping concentration of said drift layer exceeds $10^{13}$ cm$^{-3}$.

9. A transistor according to claim 1, wherein the doping concentration of said drift layer exceeds $10^{15}$ cm$^{-3}$.

10. A transistor according to claim 1, wherein each unit cell contains a substantially vertical trench extending to the drift layer with the insulating layer separating the gate electrode from the drift layer, a p-type base layer extends laterally from one trench to a trench belonging to an adjacent active region and forms the channel region layer at the interface thereof to an insulating layer extending along a substantially vertical wall of said trench, and the lateral width of said base layer within a cell is equal to or larger than the lateral width of the accumulation region defined as the width of said trench bottom.

11. A transistor according to claim 1, wherein each unit cell thereof has a part of the drift layer arranged laterally to the channel region layer with the insulating layer and the gate electrode arranged on top of the channel region layer and extending laterally at least from the source region layer to the drift layer for forming a lateral, conducting inversion channel in the channel region layer upon applying a voltage to the gate electrode, a p-type base layer is arranged beneath the source region layer so as to, together with the channel region layer, separate the source region layer from the drift layer, and the laterally width of said base layer within a unit cell is equal to or larger than the lateral width of the accumulation region defined as the lateral width of the drift layer beneath the insulating layer between two adjacent channel region layers.

* * * * *